Sept. 11, 1956 G. B. HERZOG ET AL 2,762,955

TRANSISTOR ELECTRODE CONTACTS

Filed Nov. 15, 1952

INVENTORS
GEORGE C. SZIKLAI &
GERALD B. HERZOG

BY J. C. Whittaker
ATTORNEY 2,762,955

TRANSISTOR ELECTRODE CONTACTS

Gerald B. Herzog, New Brunswick, and George C. Sziklai, Princeton, N. J., assignors to Radio Corporation of America, a corporation of Delaware Application November 15, 1952, Serial No. 320,714

9 Claims. (Cl. 317—235)

This invention pertains to semiconducting devices, such as transistors, and particularly to improved means for achieving safer operation and for protecting such devices from damage.

Two major types of transistors have been described in the prior art. One of these is known as the point contact transistor and comprises a body of semiconductor material of a particular type of conductivity, either N-type or P-type. A pair of small area electrodes make rectifying contact with one surface of said body and a third or base electrode makes ohmic contact with another portion of the body. In the manufacture of such a device, an electroforming operation is employed so that the completed device will have a current gain greater than one. In operation of such a device having an N-type body, one small area electrode is biased in the forward direction or positive with respect to the base and acts as the emitter of electrical charges. As such, the emitter electrode injects holes or minority charge carriers into the N-type germanium body in response to an input signal. The other small area electrode is biased in the reverse direction or negative with respect to the base and acts as a collector for the injected charges. An output circuit is connected to the collector electrode. In a transistor having a P-type body, the emitter is biased negative and the collector positive, both with respect to the base, and the emitter injects electrons.

The other major type of transistor referred to is known as the junction transistor and comprises a semiconductor body of N-type or P-type conductivity having therein zones of the opposite type conductivity, each zone being separated from the body by a rectifying barrier. A base electrode is also connected to the body of the device. In a transistor having a body of N-type material and P-type zones therein, that is a P-N-P transistor, one of the P-type zones, is biased positive with respect to the base and acts as the emitter electrode. The other P-type zone is biased negative with respect to the base and acts as the collector electrode. In an N-P-N transistor, the emitter and collector biases are reversed.

The principles of this invention are particularly applicable to transistors having a current gain greater than one, for example, the point contact transistor of the type described above and the junction type transistor known as the P-N hook.

In the operation of a point contact transistor having a current gain greater than one and a P-N hook type junction transistor, an input signal, applied between the emitter and the base, produces a flow of current between the emitter and the collector. If, by chance, bias and signal voltages are applied to the emitter electrode and collector electrode while the base electrode remains disconnected from its proper place in the circuit, in effect a short-circuit results and current flows between the emitter and collector. In devices of the type described, this emitter-to-collector current may be of such magnitude as to damage the transistor.

A principal object of this invention is to provide a semiconductor device of improved structural forms.

Another object is to provide an improved semiconductor device having means for insuring the safe operation of the device in a circuit.

A further object is to prevent improper application of energizing voltages to semiconductor devices to protect them from damage incident thereto.

In general, the principles and objects of this invention are accomplished by providing improved means for preventing operating potentials from being applied to the emitter and collector electrodes of a transistor when the base electrode is not connected in circuit. Thus, an important feature of the invention comprises improved means for preventing inadvertent effective short-circuiting of the emitter and collector electrodes of a transistor.

The invention is described in greater detail with reference to the drawings wherein.

Like elements are designated by the same reference numerals throughout the drawings.

Figure 1:
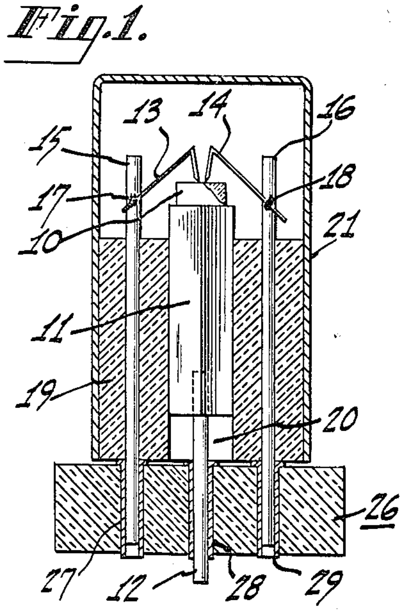
Fig. 1 is a sectional, elevational view of a semiconductor device embodying the principles of the invention.

One form of transistor to which the principles of the invention may be applied is shown in U. S. Patent 2,538,593. The transistor is a point contact type device such as shown in Fig. 1 and includes a block 10 of semiconductor material. Block 10 may, for example, consist of a crystal of boron, silicon, germanium, selenium or tellurium containing a small but sufficient number of atomic impurity centers or lattice imperfections as commonly employed for best results in crystal rectifiers. Germanium is the preferred material for block 10 and may be prepared so as to be an electronic, N-type, or hole, P-type, semiconductor as is well known. The surface of block 10 may be polished and etched in conventional manner.

Block 10 is soldered or sweated to bar 11 which may, for example, consist of brass or any other suitable electric conductor. Bar 11 accordingly represents the base electrode of the transistor. A stiff wire or pin 12 of conducting material such as a heavy nickel wire is soldered or otherwise secured to bar 11 to provide electrical contact with block 10.

Point electrodes 13 and 14 which represent the emitter and collector electrodes, consist each of a fine, stiff or resilient filament or wire having pointed tips. Wires 13 and 14 may consist of tungsten or Phosphor bronze and may have a diameter between 3 and 10 mils. The tips of the wires may have a diameter of the order of two tenths of a mil.

Wires 13 and 14 are welded to metal supports 15 and 16 as shown at 17, 18. Supports 17 and 18 may also consist of heavy nickel wire embedded in and extending through an insulating cylindrical body 19 which may consist, for example, of a suitable plastic material such as Bakelite, Cibanite or Durez. Supports 15 and 16 are preferably molded into cylinder 19. Cylinder 19 is provided with a central cylindrical aperture 20 into which bar 11 may be pressed. The dimensions of aperture 20 and of bar 11 are such that the bar has a press fit with cylinder 19. Preferably, pin 12 and supports 15, 16 are arranged in a common plane and extend beyond the bottom of cylinder 22 to form pins by means of which bias and signal voltages are applied to the transistor.

The device preferably is enclosed by housing 21 which may have a cup-shape as shown in Fig. 1. Housing 21 may consist of a plastic material or of nickel-plated cold-rolled steel. Housing 21 may have a press fit with cylinder 19 and has the purpose of protecting the semiconductor block 10 and its point contacts from mechanical damage and from the deleterious action of the air and chemicals contained therein.

Figure 2:
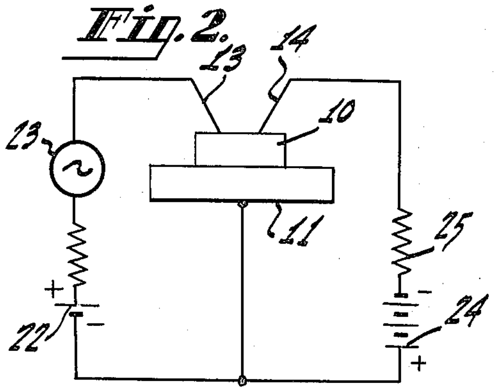
Fig. 2 is a schematic representation of the device shown in Fig. 1 and a circuit in which it may be operated.

Referring to Fig. 2, in operation of a device such as that shown in Fig. 1, one of the point contact electrodes, e. g. 13, is arranged to operate as an emitter. If the block 10 is of N-type material, the electrode 13 is biased in the forward direction or positive with respect to the base 11 by being connected to the positive pole of a battery 22, the negative pole of which is connected to the base electrode 11. A signal source 23 is connected in the emitter-to-base circuit. The electrode 14 is operated as the collector electrode and is biased in the reverse direction or negative with respect to the base 11 by being connected to the negative pole of a battery 24, the positive pole of which is connected to the base electrode 11. A load impedance 25 is connected in the collector-to-base circuit. If the block 10 were P-type, the signs of these bias voltages would be reversed so that the emitter would be negative and the collector positive, both with respect to the base electrode.

In operation of the point contact transistor, assumed to have an N-type body 10, in the circuit shown schematically in Fig. 2, under the influence of the signal from the source 23, the emitter electrode injects minority charge carriers or holes into the N-type body. The holes diffuse toward the collector electrode with a resultant increase in current flow through the collector circuit.

In a circuit of the type described, the transistor may be inadvertently partially inserted into or partially removed from the circuit when the current sources have been connected so that the current will flow in the circuit immediately when the transistor is "plugged in." If the emitter and collector leads make contact with the operating voltages before the base lead does, current flows from the emitter to the collector in an amount which depends on the resistance and voltage in the emitter circuit. The emitter-to-collector current flow may be of such a magnitude that the transistor is very quickly damaged. To overcome this problem and to provide an improved device which may be inserted in a circuit without first disconnecting the current leads, according to the invention, the transistor is so constructed that when placed in an operating circuit, the base lead must make contact either before both the emitter and collector or before at least one of these does.

In accordance with the present invention, means for achieving this protection is shown in Fig. 1. As shown, the base pin 12 is made longer than both the emitter and collector supports or pins 15 and 16 respectively. With this arrangement, when the device is inserted into a socket 26 in which all of the receptacles 27, 28, 29 are of the same length, the base pin 12 must make contact with its receptacle 28 before either the emitter or collector leads thereby preventing effective short-circuiting of the emitter and collector electrodes by inadvertently connecting them in circuit before the base electrode.

Figures 3, 4, 5:
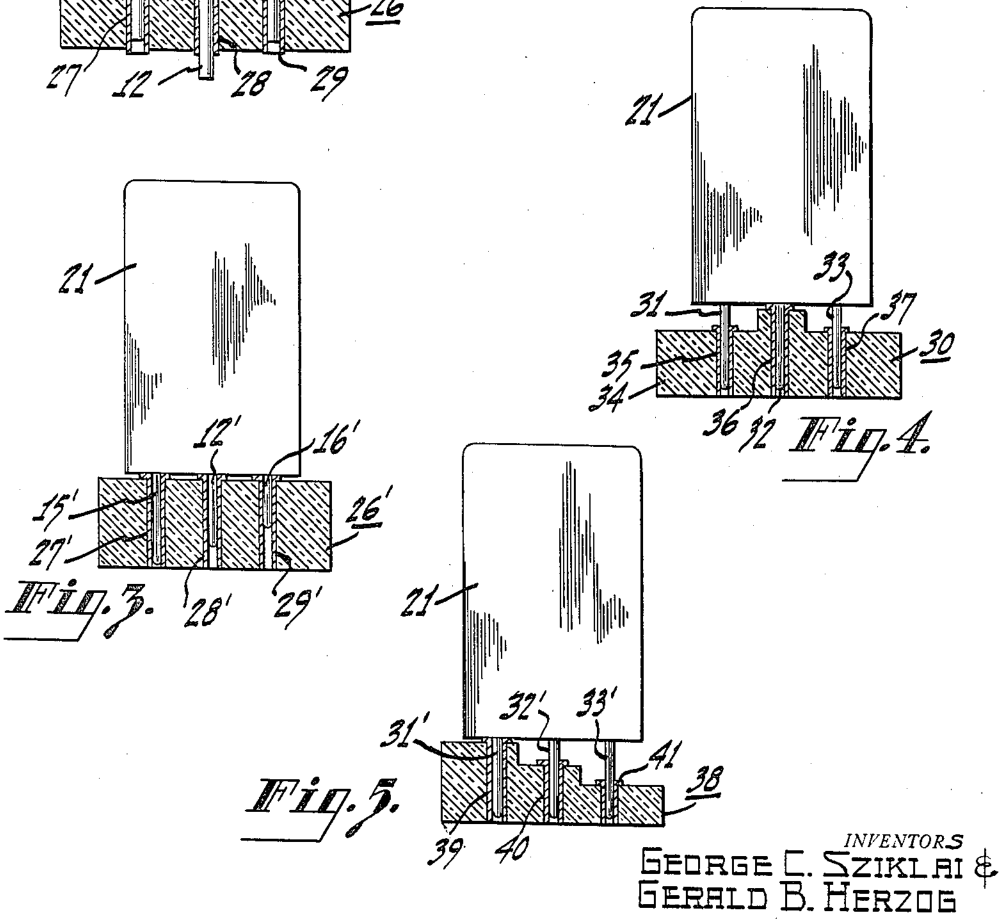
Fig. 3 is an elevational view of a modification of a portion of the device shown in Fig. 1.
Fig. 4 is a sectional, elevational view of socket contacts embodying the principles of the invention and used in conjunction with a transistor; and, Fig. 5 is a sectional, elevational view of a modification of the socket contacts shown in Fig. 4.

Another embodiment of the invention is shown in Fig. 3. In this embodiment, the base lead 12′ is made longer than only one of the other leads, in this case the collector lead 16′. However, the base lead may be made longer than emitter lead 15′ instead of the collector lead 16′. With this arrangement and with the socket 26′ having equal length receptacles 27′, 28′, 29′, either the emitter or collector may make contact before the base. However, the shorter one of these cannot make contact until after the base does and safe operation from the standpoint of effective emitter to collector shorting is assured. As an alternative, either the emitter lead 15′ or collector lead 16′ and the base lead 12′ may be the same length so long as the third lead is shorter than the base lead and the other element lead.

A further modification of the invention is shown in Fig. 4 wherein a socket 30, adapted to receive a transistor having equal length contact pins 31, 32, 33, for emitter, base, and collector respectively, is constructed to assure the application of voltages to the transistor leads in the desired order. The socket 30 comprises an insulating support member 34 of plastic or fiber or the like carrying a plurality of contact receptacles 35, 36, 37 for the pins or leads 31, 32, 33 of the transistor. The receptacles of the socket are of unequal length with the contact 36 adapted to receive the base pin 32 of the transistor, being longer than the other two contacts 35 and 37 adapted to receive the emitter and collector pins 31 and 33 respectively. In an alternative construction shown in Fig. 5, a socket 38 has receptacles 39, 40, 41 for the equal length emitter, base, and collector pins 31′, 32′, 33′ of a transistor respectively. The base pin receptacle 40 is made longer than only one of the other receptacles, for example the emitter pin receptacle 39. Alternatively, the base pin receptacle 40 may be the same length as the collector contact 39 if desired.

What is claimed is:

1. A semiconductor device comprising a body of semiconductor material, a plurality of electrodes connected in operative relationship with said body, and a lead connected to each of said electrodes, said leads being of unequal length to insure selective application of voltages to said leads while said device is being inserted in an operating circuit.

2. A semiconductor device comprising a body of semiconductor material, a plurality of electrodes connected in operative relationship with said body, a lead connected to each of said electrodes, said leads being of equal length and means associated with said leads for insuring the selective application of voltages to said leads while said device is being inserted in an operating circuit.

3. A semiconductor device comprising a body of semiconductor material, a plurality of electrodes connected in operative relationship with said body, a lead connected to each of said electrodes, said leads being of equal length, a socket mounted in operative relationship with said device and adapted to receive said leads, and means connected to said socket for insuring the selective application of voltages to said leads when said device is inserted in an operating circuit and to insure the application of said voltages to at least one of said electrodes before the others are connected in circuit.

4. A semiconductor device comprising a body of semiconductor material, a plurality of electrodes connected in operative relationship with said body, a base electrode connected to said body, and leads connected to each of said electrodes, the lead to said base electrode being longer than the leads to said plurality of electrodes whereby operating voltages are applied to said electrodes in a predetermined order.

5. A semiconductor device comprising a body of semiconductor material, a plurality of electrodes connected in operative relationship with said body, a base electrode connected to said body, and leads connected to each of said electrodes, the lead to said base electrode being longer than the lead to at least one other of said plurality of electrodes whereby operating voltages are applied to said electrodes in a predetermined order.

6. A semiconductor device comprising a body of semiconductor material, an emitter electrode and a collector electrode connected to said body, a base electrode connected to said body, and a lead connected to each of said electrodes, the lead to said base eletcrode being longer than the leads to said collector and emitter electrodes whereby operating voltages are applied to said electrodes in a predetermined order.

7. A semiconductor device comprising a body of semiconductor material, an emitter electrode and a collector electrode connected to said body, a base electrode connected to said body, and a lead connected to each of said electrodes, the lead to said base electrode being longer than the lead to said emitter electrode or said collector electrode whereby operating voltages are applied to said electrodes in a predetermined order.

8. A semiconductor device comprising a body of semiconductor material, a plurality of electrodes connected in operative relationship with said body, a lead connected to each of said electrodes, a socket mounted in operative relationship with said device, said socket including contact receptacles of unequal length for receiving said leads and controlling the order of application of operating voltages to said electrodes, the leading portions of said receptacles which receive said leads being disposed in different planes.

9. A semiconductor device comprising a body of semiconductor material, an emitter electrode and a collector electrode connected to said body, a base electrode connected to said body, and a lead connected to each of said electrodes, the lead to said base electrode being longer than the lead to said emitter electrode or said collector electrode, a socket mounted in operative relationship with said device, said socket including electrical contact receptacles of different lengths adapted to receive said leads connected to each of said electrodes, the leading portions of said receptacles which receive said leads being disposed in different planes such that the lead connected to said base electrode is inserted into its receptacle before at least one of the other leads connected to the emitter and collector electrodes is inserted into its receptacle.

References Cited in the file of this patent

UNITED STATES PATENTS

| | | |
|---|---|---|
| 1,179,728 | Knapp | Apr. 18, 1916 |
| 1,672,067 | Labre | June 5, 1928 |
| 2,584,990 | Dimond | Feb. 12, 1952 |
| 2,595,475 | McLaughlin | May 6, 1952 |
| 2,618,690 | Stuetzer | Nov. 18, 1952 |
| 2,622,213 | Harris | Dec. 16, 1952 |

FOREIGN PATENTS

| | | |
|---|---|---|
| 11,960 | Great Britain | May 22, 1913 |